US008179290B2

(12) United States Patent
Motoe

(10) Patent No.: US 8,179,290 B2
(45) Date of Patent: May 15, 2012

(54) ELECTRONIC APPARATUS AND KEY OPERATION CONTROL METHOD

(75) Inventor: Hironori Motoe, Ome (JP)

(73) Assignee: Kabushiki Kaisha Toshiba (JP)

( * ) Notice: Subject to any disclaimer, the term of this patent is extended or adjusted under 35 U.S.C. 154(b) by 1098 days.

(21) Appl. No.: 12/048,026

(22) Filed: Mar. 13, 2008

(65) Prior Publication Data

US 2008/0238727 A1  Oct. 2, 2008

(30) Foreign Application Priority Data

Mar. 28, 2007  (JP) ................... 2007-084277

(51) Int. Cl.
*H03K 17/94* (2006.01)
*H03M 11/00* (2006.01)
*B41J 5/00* (2006.01)

(52) U.S. Cl. .......................................... 341/23; 400/489

(58) Field of Classification Search .................... 241/23; 400/489; 341/23
See application file for complete search history.

(56) References Cited

U.S. PATENT DOCUMENTS

2006/0250357 A1* 11/2006 Safai .......................... 345/157

FOREIGN PATENT DOCUMENTS

| JP | 3-262024 | | 11/1991 |
| JP | 04-315220 | A | 11/1992 |
| JP | 5-4239 | | 1/1993 |
| JP | 08-115150 | A | 5/1996 |
| JP | 08115150 | * | 5/1996 |
| JP | 2000-089896 | A | 3/2000 |
| JP | 2000089896 | * | 3/2000 |
| JP | 2007-025944 | A | 2/2007 |

OTHER PUBLICATIONS

Notice of Reasons for Rejection mailed by Japan Patent Office on Mar. 22, 2011 in the corresponding Japanese patent application No. 2007-084277.

* cited by examiner

*Primary Examiner* — Rexford N Barnie
*Assistant Examiner* — Toan Vu
(74) *Attorney, Agent, or Firm* — Knobbe, Martens, Olson & Bear LLP

(57) ABSTRACT

According to one embodiment, an electronic apparatus includes a key operation unit including a first region in which a first key group is arranged and a second region in which a second key group is arranged, a switch, and a key operation control unit which outputs, when a given key of the first key group is pressed together with an operation of the switch, a key code assigned to a key located at a position in the second region which corresponds to a position of the given key in the first region, and outputs, when an arbitrary key of the second key group is pressed, a key code assigned to a key located at a position in the first region which corresponds to a position of the arbitrary key in the second region.

5 Claims, 12 Drawing Sheets

|  | b1 | b2 | b3 | |
|---|---|---|---|---|
|  | Key number | Key code1 (selection switch : Off) | Key code2 (selection switch : On) | For lower-case character / For upper-case character |
|  | ⋮ | ⋮ | ⋮ | |
| a1 | 46 | z | n | |
|  | ⋮ | ⋮ | ⋮ | |
| a2 | 52 | n | z | |
|  | ⋮ | ⋮ | ⋮ | |
FIG. 4
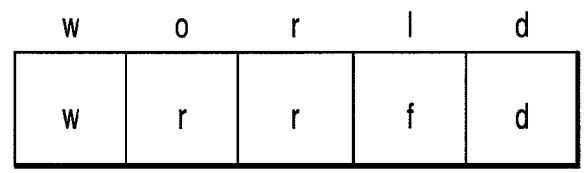
FIG. 5
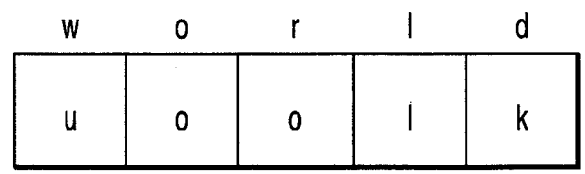
FIG. 6

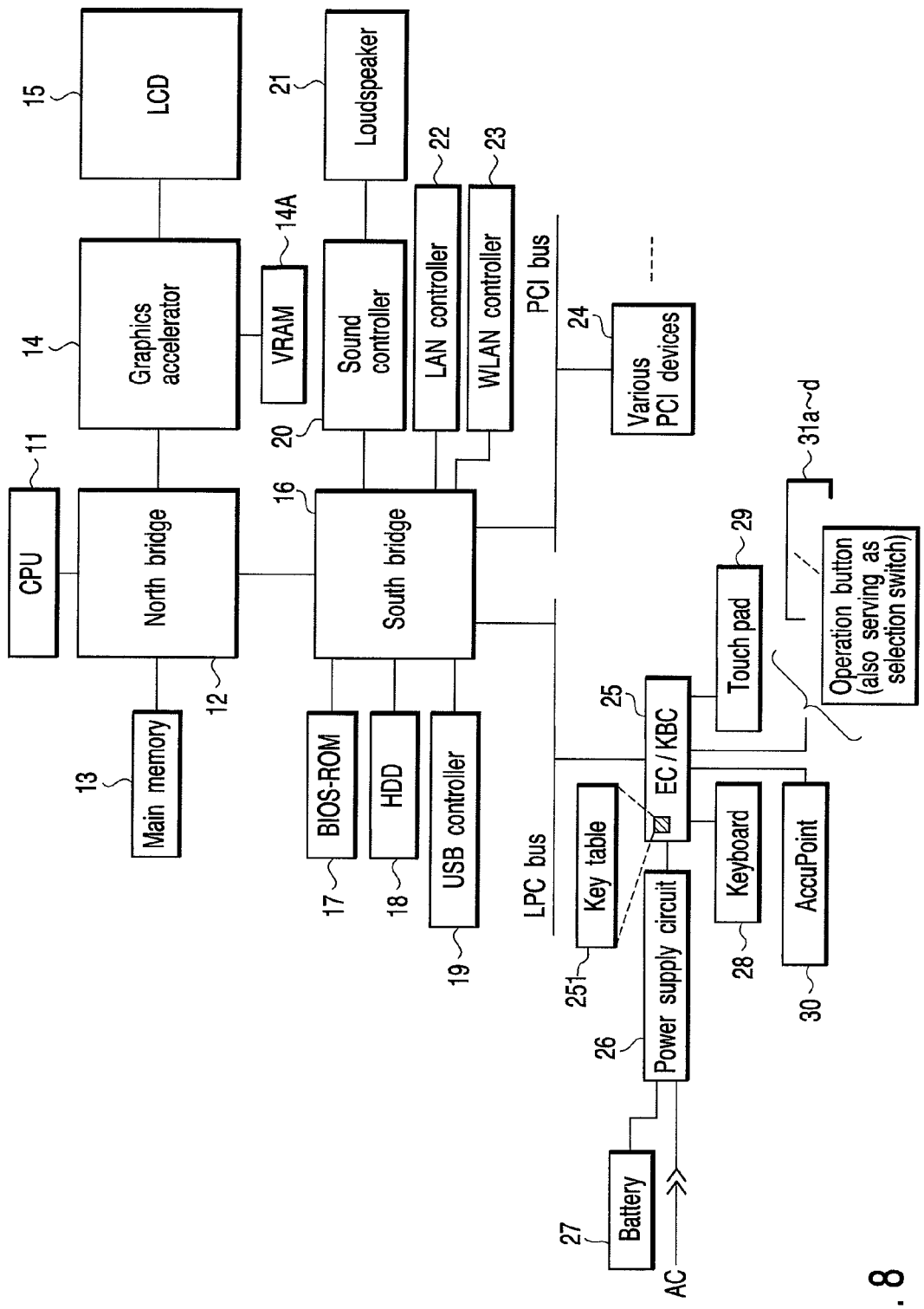
F I G. 8

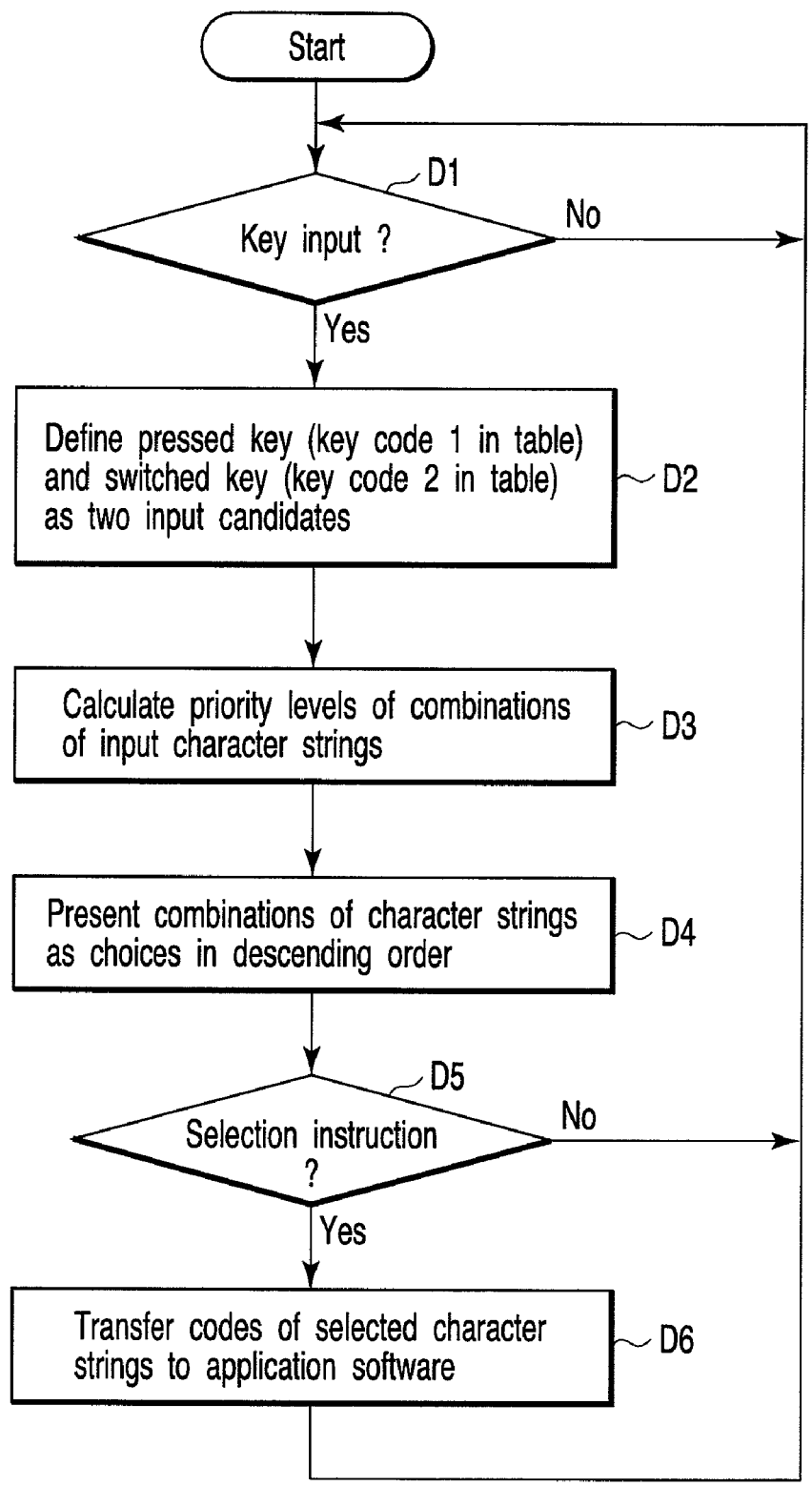
F I G. 17

ELECTRONIC APPARATUS AND KEY OPERATION CONTROL METHOD

CROSS-REFERENCE TO RELATED APPLICATIONS

This application is based upon and claims the benefit of priority from Japanese Patent Application No. 2007-084277, filed Mar. 28, 2007, the entire contents of which are incorporated herein by reference.

BACKGROUND

1. Field

One embodiment of the invention relates to a key operation control technique suitably applied to an electronic apparatus such as a notebook computer, personal digital assistant (PDA), or keyboard.

2. Description of the Related Art

In recent years, a variety of battery powered portable electronic apparatuses such as notebook computers and PDAs have been developed. Along with advances in wireless communication infrastructure, users can easily transmit or receive data at remote locations or on the move. Thus a stronger demand for wireless communication has arisen.

An electronic apparatus of this type may have the following operation style. That is, a user may operate the electronic apparatus with one hand while holding it with the other hand in an unstable state (e.g., in a car). Operability with one hand becomes an important factor in determining the product value. In addition to an electronic apparatus of this type, even a desktop electronic apparatus may have an operation style in which the user operates the device with one hand while holding references with the other. Operability with one hand is a feature to be considered. A variety of proposals for efficiently operating a two hand keyboard with one hand have been made (e.g., Jpn. Pat. Appln. KOKAI Publication No. 3-262024).

The technique described in Jpn. Pat. Appln. KOKAI Publication No. 3-262024 assumes a special keyboard called a thumb keyboard having two shift keys whose roles are different from those of a standard keyboard. For this reason, the thumb keyboard is not applicable to the standard keyboard because the original function of the shift key is disabled.

Also, a character located on the reference side of a target character is temporarily displayed and converted into a target character, resulting in cumbersome operation. This key operation is not efficient at all.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 4 is an exemplary view showing a key table held by the EC/KBC of the electronic apparatus according to the first embodiment;

FIG. 5 is an exemplary view showing inputting characters with only keys arranged on the left hand side in the electronic apparatus according to the first embodiment;

FIG. 6 is an exemplary view showing inputting characters with only keys arranged on the right hand side in the electronic apparatus according to the first embodiment of the present invention;

FIG. 8 is an exemplary block diagram showing a system configuration (modification) when the role of a selection switch in the electronic apparatus of the first embodiment is assigned to an operation button;

FIG. 17 is an exemplary flowchart showing an operation sequence associated with key operation control of the electronic apparatus according to the third embodiment.

DETAILED DESCRIPTION

Various embodiments according to the invention will be described hereinafter with reference to the accompanying drawings. In general, according to one embodiment of the invention, an electronic apparatus includes a key operation unit including at least one of a first region in which a first key group is arranged and a second region in which a second key group is arranged, a switch which switchs assignment of a key code corresponding to each key of the first key group and assignment of a key code corresponding to each key of the second key group between corresponding positions in the first region and in the second region, and a key operation control unit configured to output, when a given key of the first key group is pressed together with an operation of the switch, a key code assigned to a key located at a position in the second region which corresponds to a position of the given key in the first region, and to output, when an arbitrary key of the second key group is pressed, a key code assigned to a key located at a position in the first region which corresponds to a position of the arbitrary key in the second region.

(First Embodiment)

Figure 1:
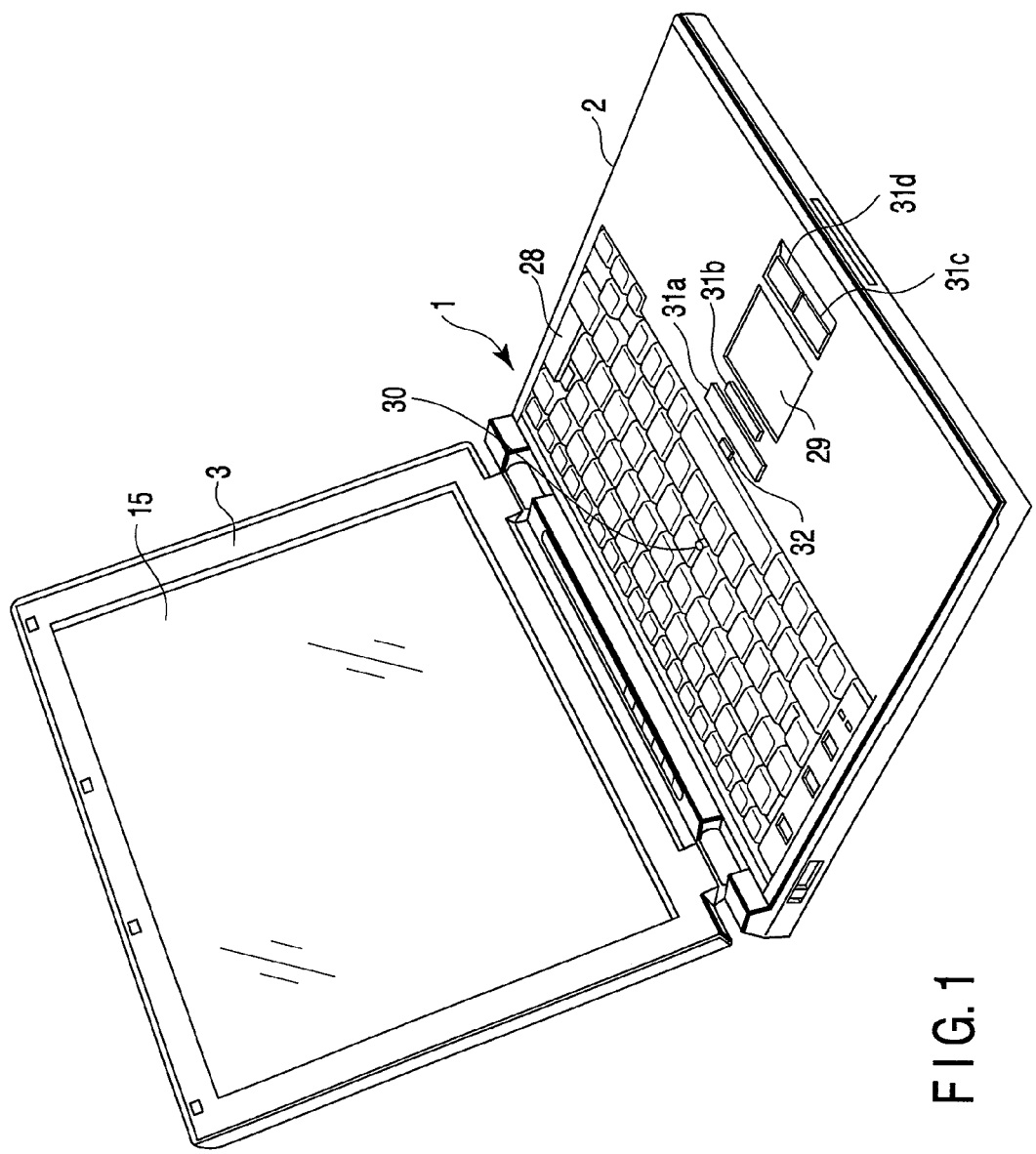
FIG. 1 is an exemplary perspective view of an electronic apparatus of the first embodiment of the invention when viewed from the front side.

FIG. 1 is an exemplary perspective view of an electronic apparatus of this embodiment in an open state of a display unit when viewed from the front side. A battery drivable notebook computer 1 implements this electronic apparatus.

The computer 1 is composed of a computer main body 2 and display panel 3. The display panel 3 incorporates a display device made up of a liquid crystal display (LCD) 15, and its screen is located at nearly the center of the display panel 3.

The computer main body 2 supports the display panel 3 mounted pivotally between an open position to expose the upper surface of the computer main body 2 and a closed position to cover the upper surface of the computer main body 2. The computer main body 2 has a low-profile box-like housing. A keyboard 28, touch pad 29, stick pointing device (AccuPoint) 30, operation buttons 31a to 31d, selection button 32, and the like are arranged on the upper surface of the computer main body 2.

A combination of the operation buttons 31a and 31b and a combination of the operation buttons 31c and 31d play roles corresponding to the left and right buttons, respectively, of a so-called mouse. The operation buttons 31a and 31b are used when the AccuPoint 30 is selected to move the mouse cursor. The operation buttons 31c and 31d are used when the touch pad 29 is selected to move the mouse cursor. The role of the selection switch 32 will be described later.

Figure 2:
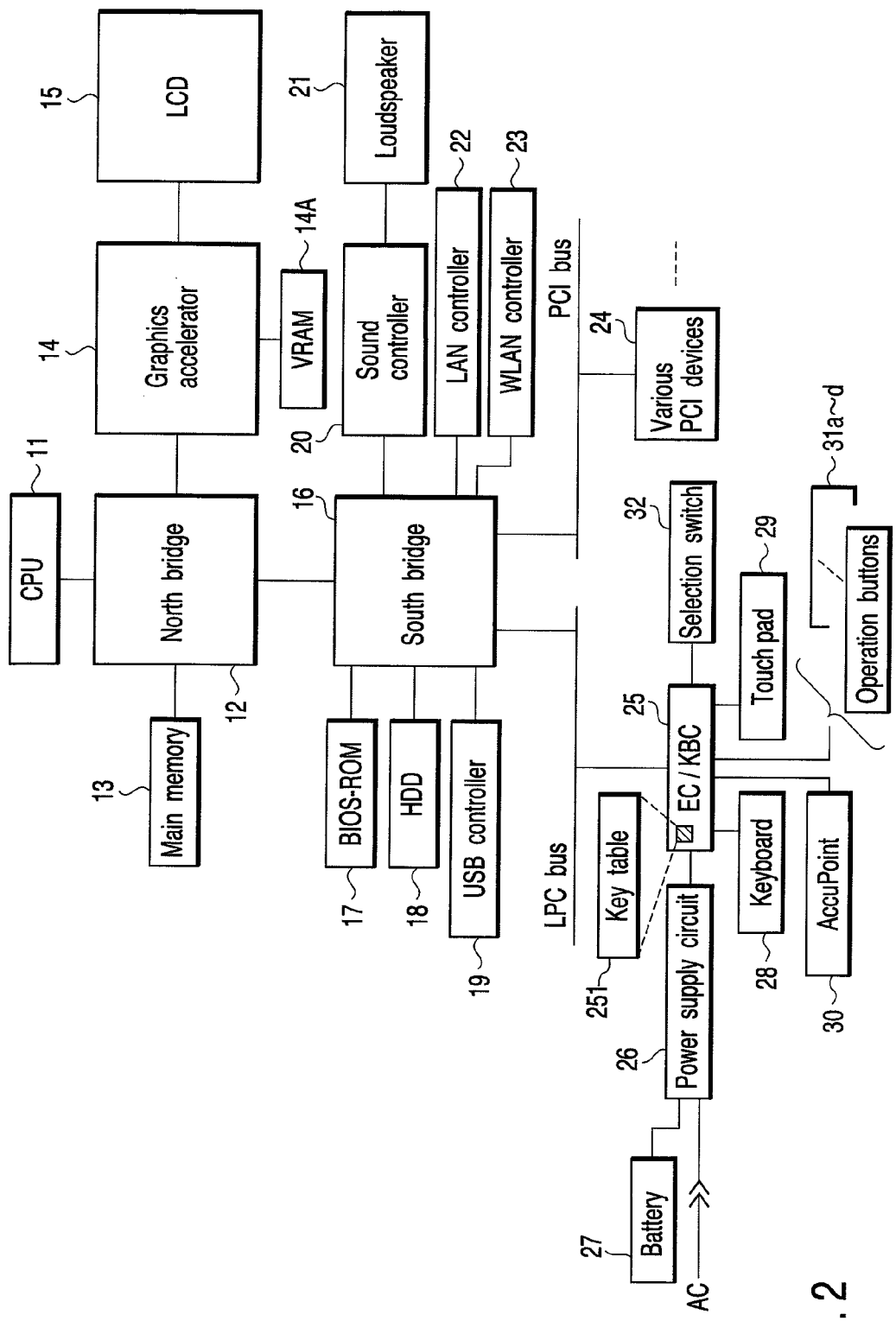
FIG. 2 is an exemplary block diagram showing the system arrangement of the electronic apparatus according to the first embodiment.

FIG. 2 is an exemplary block diagram showing the system arrangement of the computer 1. As shown in FIG. 2, the computer 1 comprises a CPU 11, north bridge 12, main memory 13, graphics accelerator 14, VRAM 14A, south bridge 16, BIOS-ROM 17, HDD 18, USB controller 19, sound controller 20, loudspeaker 21, LAN controller 22, WLAN controller 23, embedded controller/keyboard controller (EC/KBC) 25, power supply circuit 26, battery 27, and the like.

The CPU 11 is a processor for controlling the operations of the respective units in the computer 1. The CPU 11 executes an operating system loaded from the HDD 18 to the main memory 13 and various application programs including utilities that operate under the control of the operating system. The CPU 11 executes a BIOS stored in the BIOS-ROM 17. The BIOS is a program for hardware control.

The north bridge 12 is a bridge device which connects the local bus of the CPU 11 and the south bridge 16. The north bridge 12 has a function of executing communications with the graphics accelerator 14 via a bus. The north bridge 12 incorporates a memory controller for controlling access to the main memory 13. The graphics accelerator 14 is a display controller for controlling the LCD 15 used as the display monitor of this computer. The graphics accelerator 14 generates a display signal output to the LCD 15 in accordance with the image data written in the VRAM 14A.

The south bridge 16 is a controller for controlling the respective devices on the PCI and LPC buses. The south bridge 16 is directly connected to the BIOS-ROM 17, HDD 18, USB controller 19, sound controller 20, LAN controller 22, WLAN controller 23, and the like and has a function of controlling these units.

The HDD 18 is a memory device which stores various kinds of software and data. The USB controller 19 is a controller for executing communications with cable-connected USB devices. The sound controller 20 is a sound source controller for controlling the loudspeaker 21. The LAN controller 22 and WLAN controller 23 are controllers for executing communications with external devices via a network.

The EC/KBC 25 is a one-chip microcomputer in which an embedded controller for power management and the keyboard controller for controlling the keyboard 28, touch pad 29, operation buttons 31a to 31d, and selection switch 32 are integrated. The EC/KBC 25 cooperates with the power supply circuit 26 to control the power supply from the battery 27 or an external AC power supply to the respective units. The EC/KBC 25 holds a key table 251 to be described later.

Figure 3:
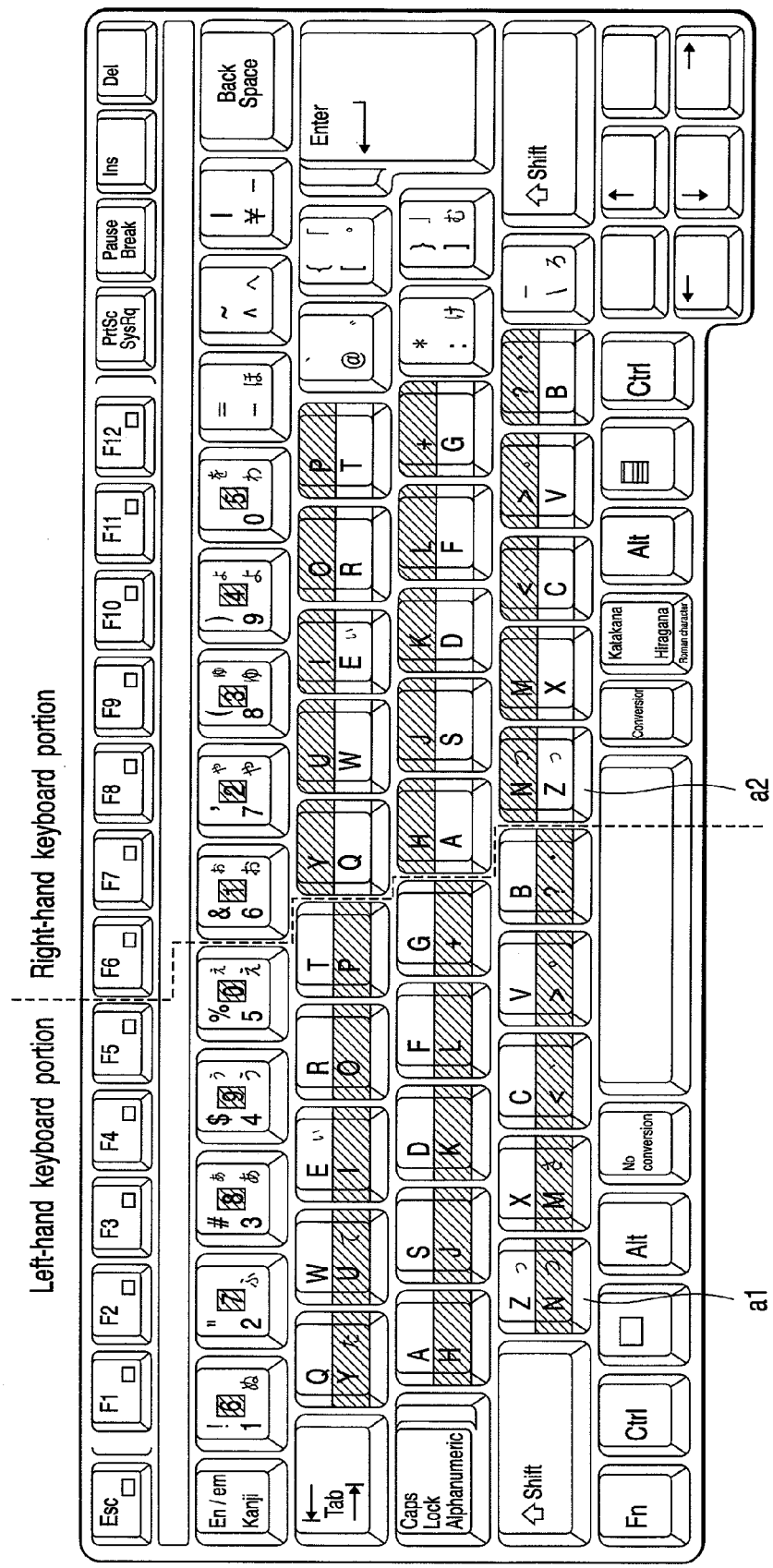
FIG. 3 is an exemplary view showing a key layout of the keyboard of the electronic apparatus according to the first embodiment.

FIG. 3 shows an example of the key layout of the keyboard 28 in the computer 11 having the above arrangement. In FIG. 3, a hiragana [Japanese character] is printed on some of the keys, but such a character has nothing to do with the constitution of the present invention. This holds true for FIG. 18.

As shown in FIG. 3, the keyboard 28 of the computer 1 has a standard key layout called a 109 keyboard. In the computer 1, a user can efficiently perform key input on the keyboard having the standard key layout with one hand, i.e., left or right hand. This will be described in detail below.

Assume that the user supports the device main body with his right hand or holds a reference with his right hand. In this case, the user performs key input with only his left hand. It is efficient to perform key input with use of only the left-hand keyboard portion in FIG. 3. Assuming that the user supports the device main body with his left hand or holds a reference with his left hand, the user performs key input with only his right hand. In this case, it is efficient to perform key input with use of only the right-hand keyboard portion in FIG. 3.

Assume that a character "z" is input. In this case, if the user is using only his left hand to press keys, he just presses a key a1 (original key) located on the left hand side in FIG. 3 with his left hand. Conversely, when the user is using only his right hand to press keys, he can press the selection switch 32 shown in FIG. 1 and a key a2 located in the right hand keyboard portion in FIG. 3 with his right hand (although the user can press the key a1 located in the left hand keyboard portion in FIG. 3 with his right hand).

More specifically, in the computer 1, the selection switch 32 switches between key codes assigned to pairs of keys respectively corresponding to the same positions in the left-hand keyboard portion (first region) and the right-hand keyboard portion (second region) in FIG. 3, like the pair of the keys a1 and a2. When the user uses only his left hand to press keys, if he presses the key a1 together with the selection switch 32, he can input a character "n" although this character must originally be input by pressing the key a2 located in the right hand keyboard portion in FIG. 3.

To switch between the key codes, the EC/KBC 25 holds the key table 251 having a unique arrangement. FIG. 4 shows an example of the key table 251 held by the EC/KBC 25.

As shown in FIG. 4, the key table 251 has three fields, a key number field b1, key code 1 field b2, and key code 2 field b3. The key number field b1 is an area holding the number of each key. The EC/KBC 25 acquires two key codes of each key using the key numbers as indices. The key number of the key a1 shown in FIG. 3 is 46, and that of key a2, 52.

The key code 1 field b2 is an area which holds the original key code, i.e., the key code to be assigned when the user presses the corresponding key without pressing the selection switch 32. The key code 2 field b3 is an area which holds a key code assigned when the user presses the corresponding key together with the selection key 32. The key code table 251 includes two tables, a lower-case character table and an upper-case character table. The user presses a so-called shift key to switch from the lower-case character table to the upper case character table (lower case→ upper case). That is, the original function of the shift key is used without any problem in the computer 1.

When the user presses only the key a1, the EC/KBC 25 determines using the key table 251 that the value "z" of the key code 1 field b2 was input out of the record which includes the key code 1 field b2 and the key code 2 field b3 and in which the value of the key number field b1 is 46. If the user presses the key a1 together with the selection switch 32, the EC/KBC determines that the user input the value "n" of the key code 2 field b3. Similarly, when the user presses only the key a2, the EC/KBC 25 determines that the value "n" of the key code 1 field b2 was input out of the record in which the value of the key number field b1 is 52. When the user presses the key a2 together with the selection switch 32, the EC/KBC 25 determines that the value "z" of the key code 2 field b3 was input.

With this mechanism, in the computer 1, the user can use the following two key input methods in addition to the normal key input method using the entire area on the keyboard in FIG. 3 when the user enters a character string, e.g., "world". FIG. 5 shows an example when the user input characters with only keys located on the left hand keyboard portion (only with the left hand), and FIG. 6 shows an example when the user input characters with only keys located on the right hand keyboard portion (only with the right hand).

Of the keys used to input the character string "world", keys "w", "r", and "d" are located in the left-hand keyboard portion, while keys "o" and "l" are located in the right-hand keyboard portion. To input characters with only keys located in the left-hand keyboard portion, as shown in FIG. 5, the user presses the keys "r" and "f" corresponding in position to the keys "o" and "l" together with the selection switch 32 in order to input characters "o" and "l". To input characters with only keys located in the right-hand keyboard portion, the user presses the keys "u", "o", and "k" corresponding in position to the keys "w", "r", and "d" together with the selection switch 32 in order to input characters "w", "r", and "d".

Figure 7:
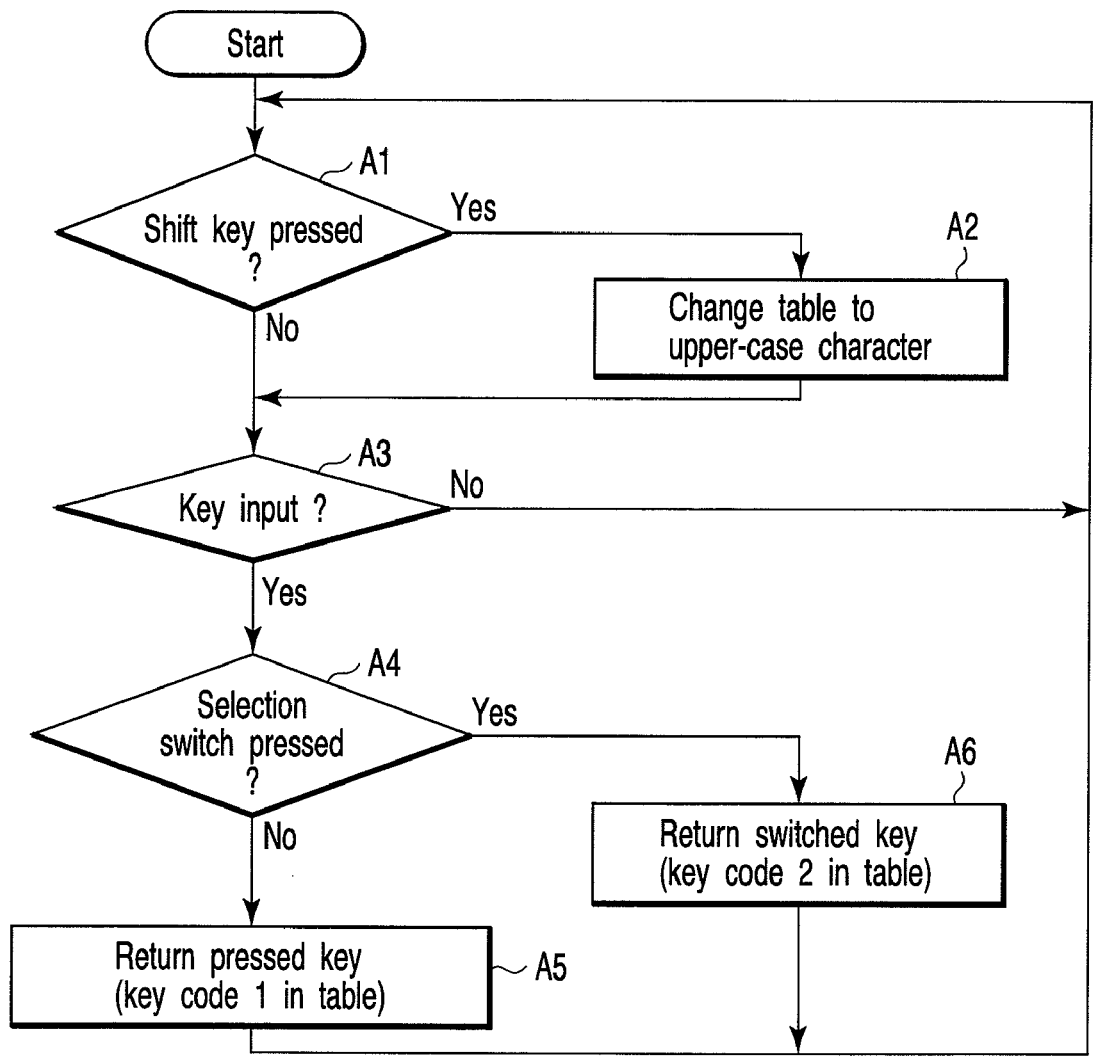
FIG. 7 is an exemplary flowchart showing an operation sequence associated with key operation control of the electronic apparatus according to the first embodiment.

FIG. 7 is an exemplary flowchart showing the operation sequence associated with key operation control of the computer 1.

When the user presses a shift key (YES in block A1), the EC/KBC 25 switches the table from the lower-case character table to the upper-case character table (block A2). When the user inputs any key (YES in block A3), the EC/KBC 25 determines whether the selection switch 32 is on (block A4). If the selection switch 32 is off (NO in block A4), the EC/KBC 25 returns a key code 1 value in the key table 251 (block A5). However, if the selection switch 32 is on (YES in block A4), the EC/KBC 25 returns a key code 2 value (block A6).

According to the computer 1, key operations with one hand in the standard keyboard can be efficiently performed as described above.

In the above description, the dedicated selection switch 32 is arranged as a switch for switching between the key codes. The present invention is not limited to this. For example, an existing button can be used as the selection switch. FIG. 8 is a block diagram showing the system arrangement of the computer 1 when the role of the selection switch 32 is assigned to the operation button 31a.

Figure 9:
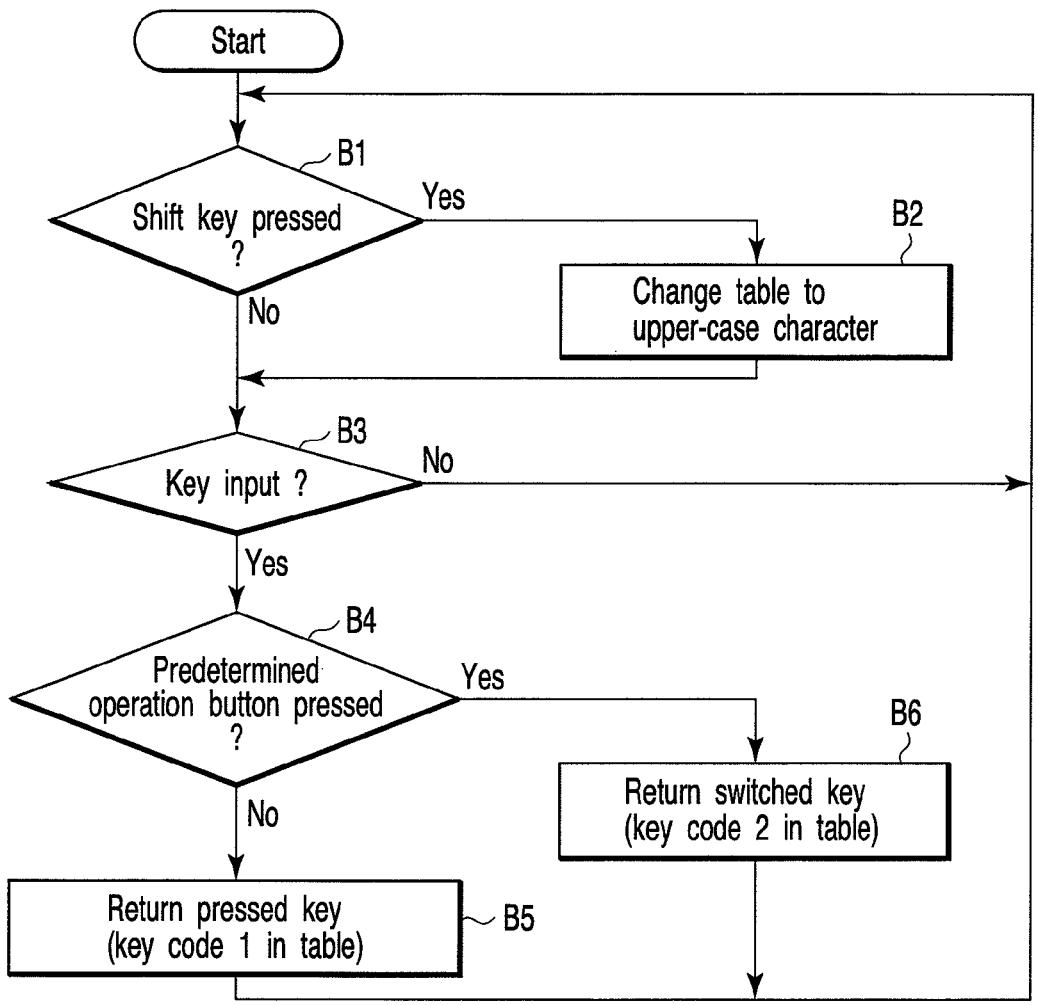
FIG. 9 is an exemplary flowchart showing an operation sequence (modification) associated with key operation control of the electronic apparatus according to the first embodiment.

The operation button 31a originally has a role as a so-called mouse button, as described above. Paying attention to the fact that no mouse button operations are performed during key input operations, the operation button 31a is also assigned a function of a selection switch. When the user presses the operation button 31a during any key input operation, or when the user presses any key a predetermined period of time after the user presses the operation button 31a, the EC/KBC determines that the operation button 31a is pressed not to function as the original mouse button but as the selection button. FIG. 9 is an exemplary flowchart showing an operation sequence associated with key operation control of the computer 1.

When the shift key is on (yes in block B1) the EC/KBC 25 switches the table from the lower-case character table to the upper case character table (block B2). When the user presses any key (YES in block B3), the EC/KBC 25 determines whether the operation button 31a is on (block B4). If the operation button 31a is off (NO in block B4), the EC/KBC 25 returns a key code 1 value in the key table 251 (block B5). If the operation button 31a is on, (YES in block B4), the EC/KBC 25 returns a key code 2 value (block B6).

As described above, even if an existing button also serves as a selection button, the key operations in the standard keyboard can be efficiently made with one hand.

(Second Embodiment)

The second embodiment of the present invention will be described below.

In the first embodiment, pressing the selection switch (dedicated key or dual function key) allows switching between the key codes. Conversely, according to the second embodiment, switching between key codes is performed based on a press force applied when a user presses each key.

Figure 10:
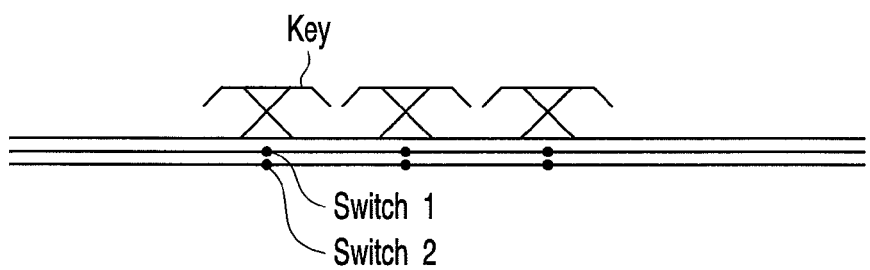
FIG. 10 is an exemplary first view for explaining a key configuration of an electronic apparatus according to the second embodiment of the invention.
Figure 11:
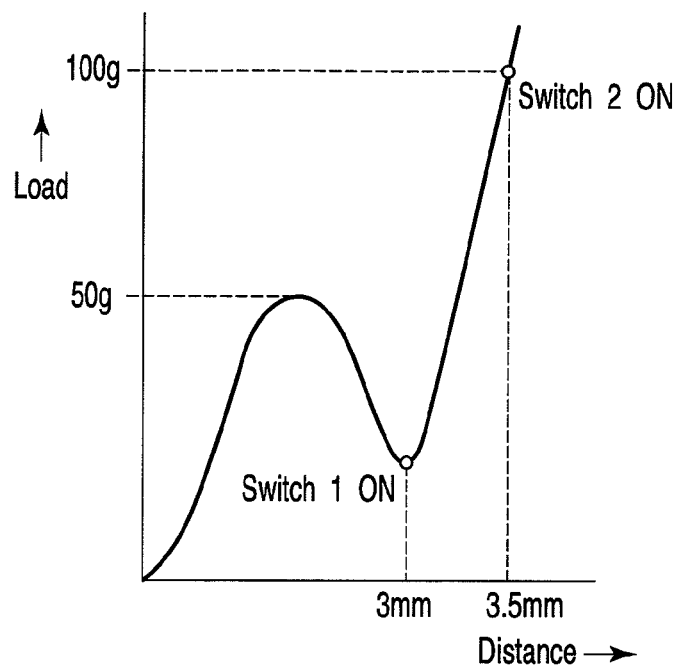
FIG. 11 is an exemplary second view for explaining the key configuration of the electronic apparatus according to the second embodiment.

As shown in FIG. 10, each key of a computer 1 has two switches, i.e., switch 1 and switch 2 for detecting that the user pressed the key. First, each key is configured such that switch 1 is turned on upon receiving a load of 50 g or more when the user feels as if he half pressed the key, for example. Second, each switch is configured such that switch 2 is turned on upon receiving a load of 100 g or more when the user feels as if he fully pressed the key, for example. That is, each key of the computer 1 is configured to allow half pressing and full pressing, i.e., two-step pressing.

In the computer 1, key code switching is implemented by configuring each key to allow half pressing and full pressing, i.e., two-step pressing. For example, when the user half presses a given key (only switch 1 is turned on), the EC/KBC 25 determines that the original key code (key code 1) was input. When the user fully presses the given key (both switches 1 and 2 are turned on), the EC/KBC 25 determines that the switched key code (key code 2) was input. The functions of half pressing and full pressing can be reversed.

Figure 12:
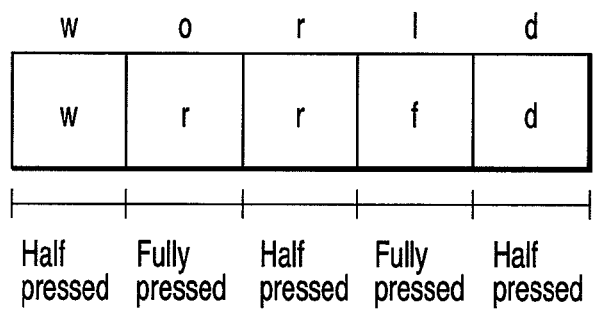
FIG. 12 is an exemplary view showing inputting characters with only keys arranged on the left hand side in the electronic apparatus according to the second embodiment.
Figure 13:
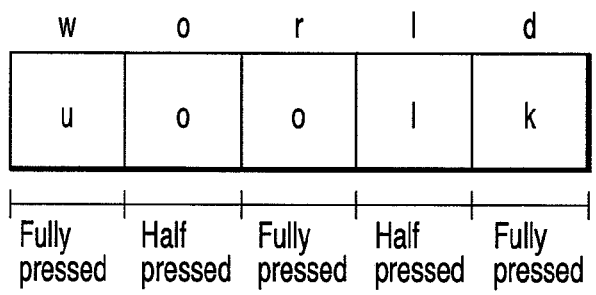
FIG. 13 is an exemplary view showing inputting characters with only keys arranged on the right hand side in the electronic apparatus according to the second embodiment.

With this mechanism, in the computer 1, the user can use the following two key input methods in addition to the normal key input method using the entire area on the keyboard in FIG. 3 when the user enters a character string, e.g., "world". FIG. 12 shows an example when the user inputs characters with only keys located on the left-hand keyboard portion (only with the left hand), and FIG. 13 shows an example when the user inputs characters with only keys located on the right-hand keyboard portion (only with the right hand).

Of the keys used to input the character string "world", keys w, "r", and "d" are located in the left-hand keyboard portion, while keys "o" and "l" are located in the left-hand keyboard portion. To input characters with only keys located in the left-hand keyboard portion, as shown in FIG. 12, the user half presses the keys "w" "r" and "d" while he fully presses the keys "r" and "f" corresponding in position to the keys "o" and "l" in order to input characters "o" and "l". In order to input characters with only keys located in the right-hand keyboard portion, the user half presses the keys "o" and "l" to input characters "o" and "l" while he fully presses "u", "o", and "k" corresponding in position to the keys "w", "r", and "d" in order to input "w", "r", and "d", as shown in FIG. 13.

Figure 14:
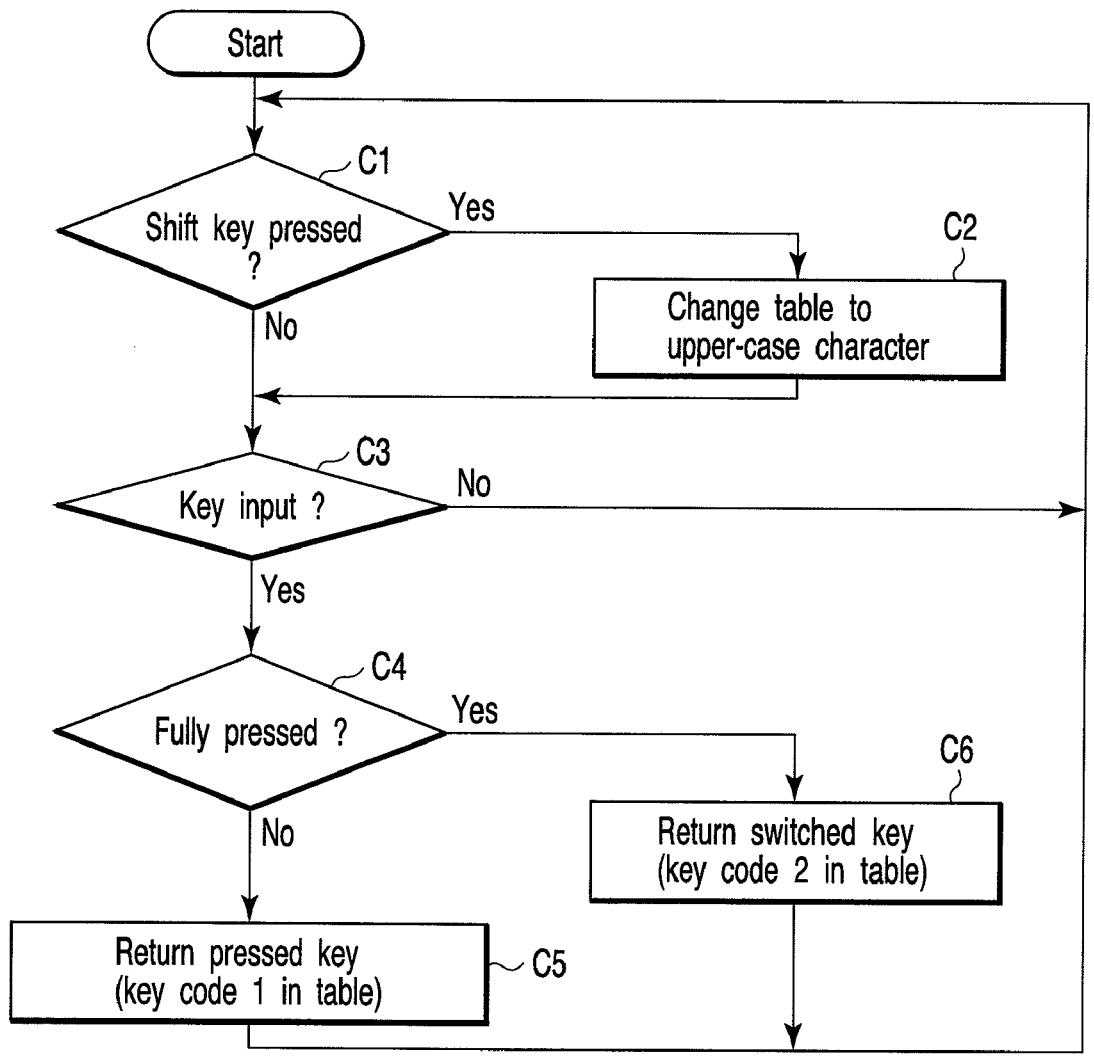
FIG. 14 is an exemplary flowchart showing an operation sequence associated with key operation control of the electronic apparatus according to the second embodiment.

FIG. 14 is a flowchart showing the operation sequence associated with key operation control of the computer 1.

When the user presses a shift key (YES in block C1), the EC/KBC 25 switches the table from the lower case character table to the upper case character table (block C2). When the user inputs any key (YES in block C3), the EC/KBC 25 determines whether the user fully pressed this key (block C4). If the user did not fully press this key (NO in block C4), the EC/KBC 25 returns a key code 1 value in the key table 251 (block C5). However, if the user fully pressed the key (YES in block C4), the EC/KBC 25 returns a key code 2 value (block C6).

According to the computer 1, key operations with one hand in the standard keyboard can be efficiently performed as described above.

(Third Embodiment)

The third embodiment of the present invention will be described below.

Figure 15:
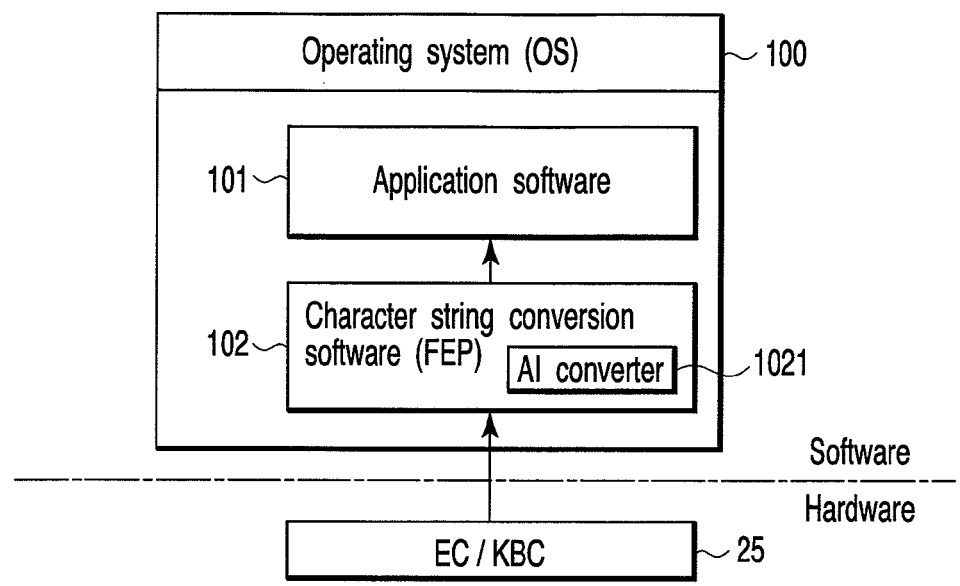
FIG. 15 is an exemplary functional block diagram associated with key input in an electronic apparatus according to the third embodiment of the invention.

In the first and second embodiments, the EC/KBC 25 holds the key table 251 having a unique arrangement and the key codes are switched under the control of the EC/KBC 25. Conversely, according to the third embodiment, an EC/KBC 25 performs normal operation (the key code of a pressed key is directly returned). One software program on an operating system serving as a host system which receives a key code from the EC/KBC 25 control key code switching. FIG. 15 is a functional block diagram associated with key input of a computer 1.

A key code from the EC/KBC 25 is finally transferred to application software 101 activated at this time. The key code is generally transferred via software called a front end processor (FEP) in order to perform, e.g., kana-kanji conversion. In the computer 1, the FEP includes a control function for switching the key codes. Software operating as this FEP is character string conversion software 102.

The character string conversion software 102 has an AI converter 1021. The AI converter 1021 holds a table corresponding to the key table 251 held by the EC/KBC 25 of the first or second embodiment. The AI converter 1021 further has various functions such as a dictionary function and an inference function of inferring a proper character which is likely to be input next from the relationship with an input character string.

For example, when the user presses a key a1 in FIG. 3 and the character string conversion software 102 receives a key code of "z" from the EC/KBC 25, the software 102 defines the key code of "n" (obtained from the table corresponding to the key table 251) as a candidate in addition to the key code of "z". Similarly, when the user presses a key a2 in FIG. 3 and the character string conversion software 102 receives the key code of "n" from the EC/KBC 25, the software 102 defines the key code "z" as a candidate in addition to the key code of "n".

When the input operation progresses, several character strings each using one of the candidates are formed (the (number of characters)th power of 2) are prepared. The character string conversion software 102 prioritizes the character strings in descending order using the function of the AI converter 1021.

Figure 16:
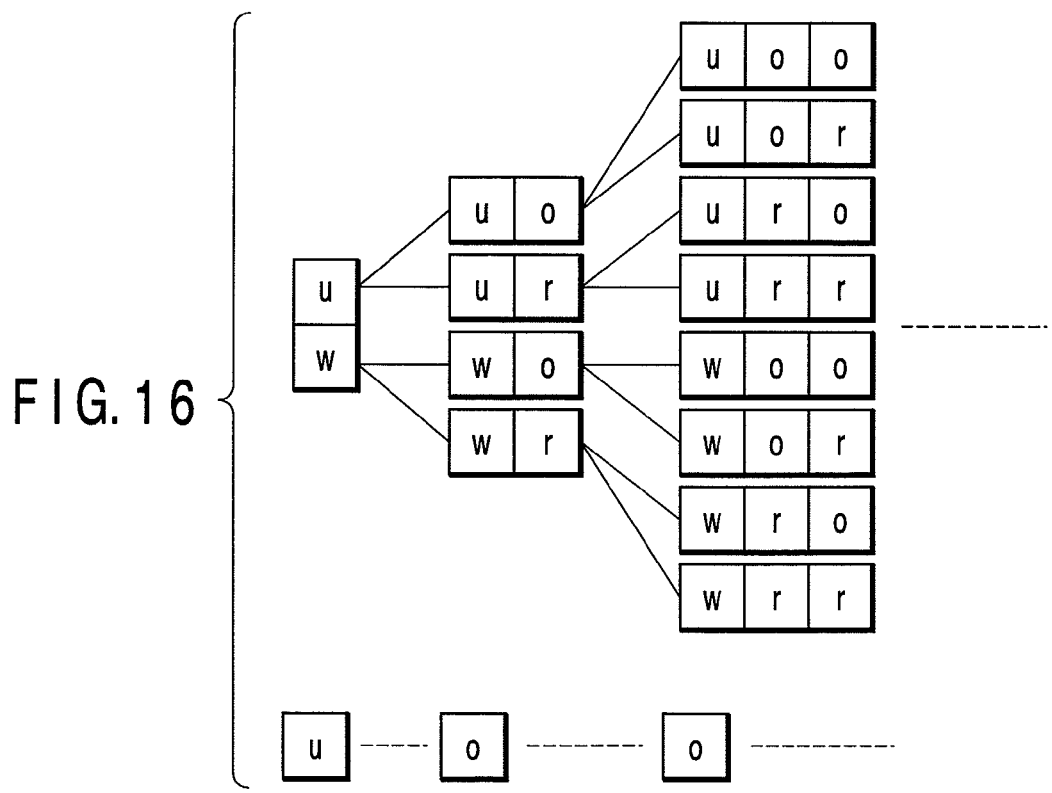
FIG. 16 is an exemplary view showing inputting characters with only keys arranged on the right hand side in the electronic apparatus according to the third embodiment.

A case in which the user inputs a character string "world" with only keys located in the right hand keyboard portion (with only the right hand) will be described with reference to FIG. 16.

Keys "w", "r", and "d" are located in the left-hand keyboard portion and keys "o" and "l" are located in the right-hand keyboard portion as keys for inputting the character string "world". To input the characters with only the keys located in the right-hand keyboard portion, the user presses "u" corresponding in position to "w". As described above, the EC/KBC 25 transfers the key code of "u" to the character string conversion software 102. The character string conversion software 102 defines "w" as a candidate in addition to "u".

The user then directly presses "o". In this case, "r" is defined as an input candidate in addition to "o". At this time, four character string candidates, i.e., "uo", "ur", "wo", "wr" are present. The user then presses "o" corresponding in position to "r", and "o" and "r" become input candidates. Eight character string candidates, i.e., "uoo", "uor", "uro", "urr", "woo", "wor", "wro", and "wrr" are present.

When the user completes pressing five keys in the same procedure as described above, 32 ($2^5$) character string candidates are present. The character string conversion software 102 prioritizes the character string candidates using the AI converter 1021 and presents a predetermined number of candidates as choices in descending order. For example, "world" is a word in a dictionary, and its character order is expected to have higher priority. Upon receiving an instruction for selecting one of the presented choices, the character string conversion software 102 transfers the key code group corresponding to the selected character strings to the application software 101.

FIG. 17 is an exemplary flowchart showing an operation sequence associated with key operation control of the computer 1.

When the user presses any key (YES in block D1), the character string conversion software 102 defines as input candidates the key code of the pressed key received from the EC/KBC 25 and the key code of the key corresponding in position to the pressed key (block D2). The character string conversion software 102 calculates the priority levels of the respective combinations of the input character strings (block D3) and presents the combinations of character strings as choices in descending order of the calculated priority levels (block D4).

Upon reception of an instruction for selecting one of the character string from the presented choices (YES in block D5), the character string conversion software 102 transfers the key code group of the selected character string to the application software 101 (block D6).

As described above, the computer 1 allows the user to perform efficient key operations in the standard keyboard with one hand.

Figure 18:
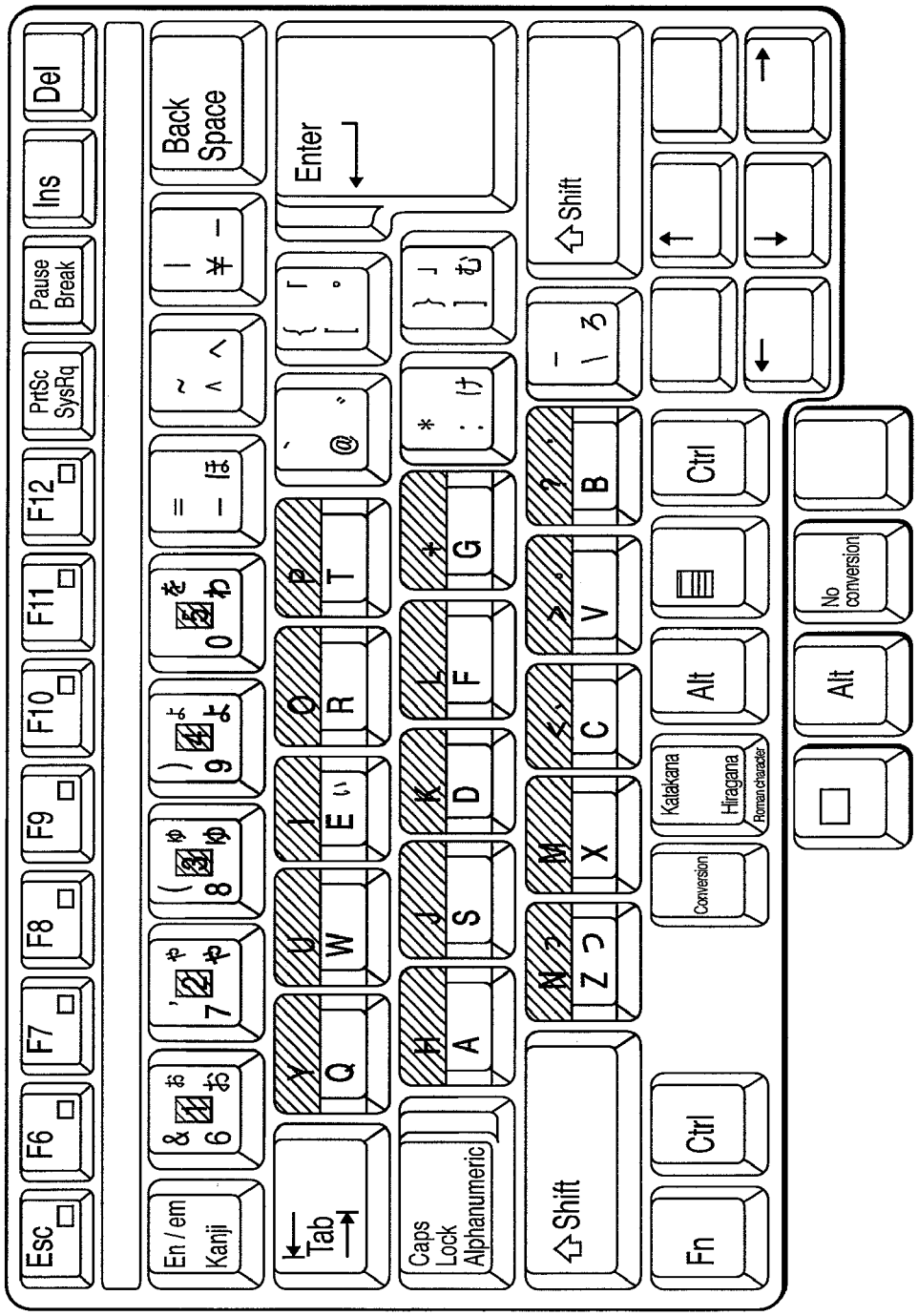
FIG. 18 is an exemplary view showing a keyboard (modification) having only one of the left and right hand sides in the electronic apparatus according to any one of the first to third embodiments.

A technique for allowing key operations using one of the left- and right-hand keyboard portions actually present in the keyboard has been described above. However, according to this technique, as shown in FIG. 18, a keyboard may have only half the number of keys of the standard keyboard, i.e., only the right-hand keyboard portion to allow key input with only the right hand. Conversely, a keyboard having only keys corresponding to the left-hand keyboard portion can be provided.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic apparatus comprising:
a key operation unit comprising at least one of a first region in which a first key group is arranged and a second region in which a second key group is arranged;
a key code generation unit configured
to generate, when a first key of the first key group is pressed, two key codes including a key code assigned to the first key and a key code assigned to a key located at a position in the second region which corresponds to a position of the first key in the first region, and
to generate, when a second key of the second key group is pressed, two key codes including a key code assigned to the second key and a key code assigned to a key located at a position in the first region which corresponds to a position of the second key in the second region; and
a key operation control unit configured to select one character string from a plurality of character strings obtained by combinations of exclusively selecting the two key codes generated by the key code generation unit, and to output a key code representing the selected character string.

2. The electronic apparatus of claim 1, wherein a first portion of an upper surface of the key operation unit is defined as the first region and a second portion of the upper surface of the key operation unit is defined as the second region.

3. The electronic apparatus of claim 1, wherein the key operation control unit is configured to present the plurality of character strings as candidates and to accept an instruction for selecting one of the presented candidates.

4. A key operation control method for an electronic apparatus comprising a key operation unit comprising at least one of a first region in which a first key group is arranged and a second region in which a second key group is arranged, the method comprising:
generating, when a first key of the first key group is pressed, two key codes including a key code assigned to the first key and a key code assigned to a key located at a position in the second region which corresponds to a position of the first key in the first region;
generating, when a second key of the second key group is pressed, two key codes including a key code assigned to the second key and a key code assigned to a key located at a position in the first region which corresponds to a position of the second key in the second region; and
selecting one character string from a plurality of character strings obtained by combinations of exclusively selecting the two generated key codes and outputting a key code representing the selected character string.

5. The method of claim 4, wherein the selecting one character string comprises presenting the plurality of character strings as candidates and accepting an instruction for selecting one of the presented candidates.

* * * * *